(12) United States Patent
Pozidis et al.

(10) Patent No.: US 8,026,715 B2
(45) Date of Patent: Sep. 27, 2011

(54) MAGNETO-RESISTANCE BASED NANO-SCALE POSITION SENSOR

(75) Inventors: Charalampos Pozidis, Thalwil (CH); Deepak Ranjan Sahoo, Zurich (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 372 days.

(21) Appl. No.: 12/245,243

(22) Filed: Oct. 3, 2008

(65) Prior Publication Data
US 2010/0085041 A1    Apr. 8, 2010

(51) Int. Cl.
G01R 33/06    (2006.01)
G01R 33/00    (2006.01)

(52) U.S. Cl. .................... 324/207.21; 324/260

(58) Field of Classification Search .......... None
See application file for complete search history.

(56) References Cited

U.S. PATENT DOCUMENTS

| | | | | |
|---|---|---|---|---|
| 5,936,237 | A * | 8/1999 | van der Weide | 250/234 |
| 6,611,140 | B1 * | 8/2003 | Bloechl et al. | 324/207.21 |
| 7,417,424 | B2 * | 8/2008 | Desplats et al. | 324/247 |
| 2002/0121897 | A1 * | 9/2002 | Mukasa et al. | 324/244 |
| 2006/0043288 | A1 * | 3/2006 | Binnig et al. | 250/309 |
| 2008/0129286 | A1 * | 6/2008 | Kahlman et al. | 324/225 |
| 2009/0224755 | A1 * | 9/2009 | Kahlman et al. | 324/252 |
| 2010/0085056 | A1 * | 4/2010 | Baechtold et al. | 324/345 |
| 2010/0116038 | A1 * | 5/2010 | Baechtold et al. | 73/105 |

OTHER PUBLICATIONS

H. Li et al.; Microelectromechanical System Microbridge deflection monitoring using Integrated Spin Valve Sensors and Micromagnets; Journal of Applied Physics; vol. 91, No. 10 May 15, 2002; pp. 7774-7776.
T. Takezaki et al.; Magnetic Field Measurement Using Scanning Magnetoresistance Microscope with Spin-Valve Sensor; Japanese Journal of Applied Physics; vol. 45. No. 38; 2006; pp. 2251-2254.
M. Nakamura et al.; Scanning Magnetoresistance Microscopy with a Magnetoresistive Sensor Cantilever; Applied Physics Letters, vol. 80, No. 15; Apr. 15, 2002; pp. 2713-2715.

* cited by examiner

*Primary Examiner* — Jermele M Hollington
(74) *Attorney, Agent, or Firm* — Tutunjian & Bitetto, P.C.; Stephen C. Kaufman

(57) ABSTRACT

A position sensor and method include a magnetic component, a first magneto-resistive sensor disposed in proximity to the magnet/coil; and a second magneto-resistive sensor disposed in proximity to the magnetic component and the first magneto-resistive sensor. The first magneto-resistive sensor and second magneto-resistive sensor are configured to sense changes in a stray magnetic field created by the magnetic component in accordance with a relative positional change between the magnetic component and the first and second magneto-resistive sensors.

19 Claims, 3 Drawing Sheets

MAGNETO-RESISTANCE BASED NANO-SCALE POSITION SENSOR

RELATED APPLICATION INFORMATION

The present application is related to U.S. application Ser. No. 12/245,171, entitled "MAGNETO-RESISTANCE BASED TOPOGRAPHY SENSING", filed currently herewith and incorporated herein by reference.

BACKGROUND

1. Technical Field

The present invention relates to position sensing, and more particularly to a system, device and method for sub-nanometer resolution position sensing which employs magneto-resistance.

2. Description of the Related Art

Position sensing with sub-nanometer resolution and high bandwidth in moving structures like piezo-scanners, flexure stages and Micro Electro Mechanical Systems (MEMS) based micro-scanners is important for closed-loop controlled operation to ensure positioning accuracy at very high speeds. Such moving stages are employed in scanning probe microscopes, nano-lithography tools, nanoscale data storage devices and experimental (probe-based) nano-fabrication tools.

Currently available position sensors based on optics, capacitors and inductive coils (for example, linear variable displacement transducers (LVDTs)), although accurate and fast, do not scale down (with respect to the dimension of the sensor) to micro-scales for use in micro-structures or in large-scale point-wise position sensing of macro-structures. Thermo-electric and piezo-resistive position sensors, on the other hand, easily scale down to micro-scale, but suffer from low bandwidth.

SUMMARY

A position sensor and method include a magnetic component, a first magneto-resistive sensor disposed in proximity to the magnet/coil; and a second magneto-resistive sensor disposed in proximity to the magnetic component and the first magneto-resistive sensor. The first magneto-resistive sensor and second magneto-resistive sensor are configured to sense changes in a stray magnetic field created by the magnetic component in accordance with a relative positional change between the magnetic component and the first and second magneto-resistive sensors.

A method for position sensing includes providing a fixed component attached to a reference position, the fixed component including one of a magnetic component and a pair of magneto-resistive sensors. A positionable component is provided on a movable platform, the positionable component including the other of the magnetic component and the pair of magneto-resistive sensors. Changes in a stray magnetic field created by a positional change are sensed between the fixed component and the positionable component, and the changes in the stray magnetic field are associated to measure the positional change.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
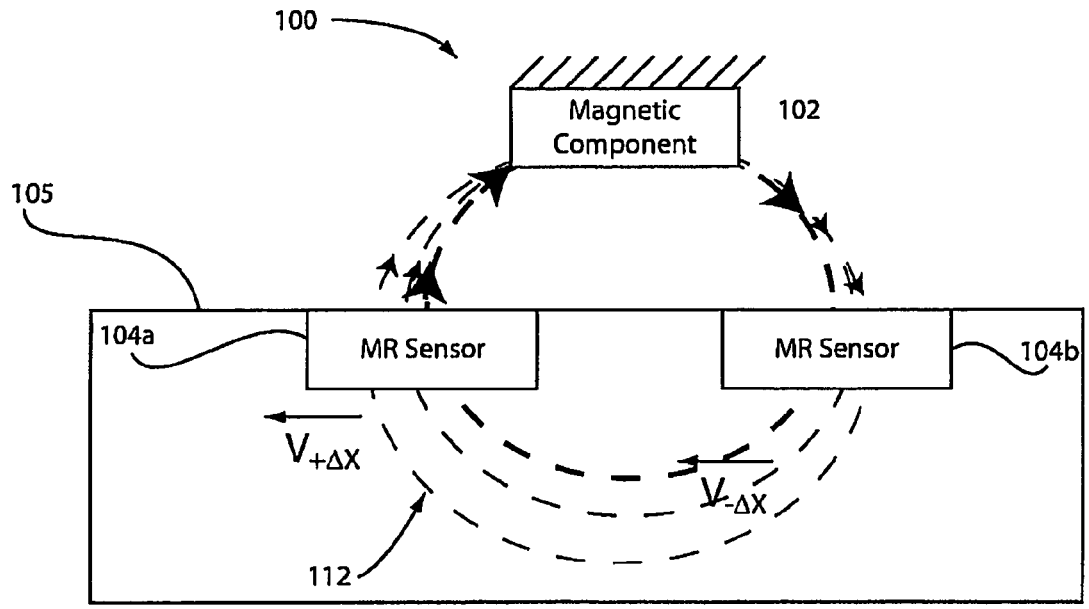
FIGS. 1A-B are cross-sectional views showing a magnet and a pair of magneto-resistive sensors (located on a platform) for sensing positional changes of the platform in accordance with the present principles.

The present principles provide new techniques for position sensing with high bandwidth and high resolution. The present principles provide the capability to include integrated sensors. The sensors can be fabricated by e.g., sputter depositing process on to a micro-structure. Particularly useful embodiments offer the combined potential for high bandwidth, well in excess of 1 MHz, and high resolution at the sub-nanometer level.

A position sensing system and method in accordance with the present principles combines sub-nanometer resolution, bandwidth in excess of 1 MHz, and scalability down to the micrometer-scale. The sensor may be fabricated using existing MEMS fabrication processes. As such, the sensor can also be used in various array configurations for point-wise local position sensing in macro-structures.

Embodiments of the present invention can take the form of an entirely hardware embodiment, an entirely software embodiment or an embodiment including both hardware and software elements. In a preferred embodiment, the present invention is implemented in hardware with software support. The software may include but is not limited to firmware, resident software, microcode, etc.

Furthermore, aspects of the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The sensors as described herein may include of be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GD-SII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1B:
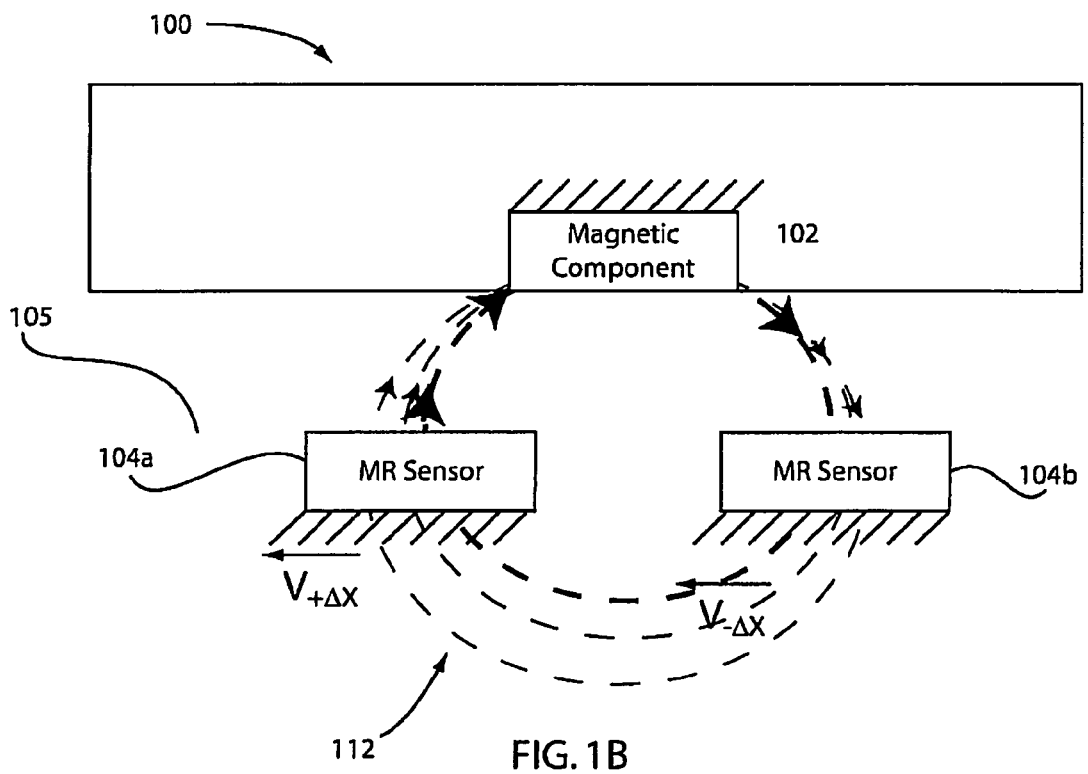

Referring now to the drawings in which like numerals represent the same or similar elements and initially to FIGS. 1A and 1B, an illustrative sensing device 100 is illustratively shown. Sensing device 100 is employed to measure position of non-magnetic platforms although magnetic platforms may be measured as well. Sensing device 100 employs a magnetic component 102 although any device such as a permanent magnet, a current loop and a magnetic layer capable of producing a stray magnetic field can be utilized. Sensing device 100 is based on magneto-resistive (MR) sensing which is used for measuring stray magnetic fields. MR sensor/device 100 provides both high bandwidth (e.g., greater than 1 MHz) and high resolution (e.g., less than 1 nm).

Device 100 may include a plurality of different configurations where a magnetic component (hereinafter magnet for simplicity) 102 and magneto resistive (MR) sensors 104 are employed, but may have their locations transposed or their locations may be altered or integrated into different components of the designs. For example, FIG. 1A depicts a magnet 102 fixed at a reference position and two MR sensors 104a and 104b which are mounted to a platform 105. FIG. 1B, depicts magnet 102 mounted on the platform 105 and the two MR sensors 104a and 104b are fixed to a reference position. The embodiments depicted in FIGS. 1A and 1B will be employed for illustrative purposes.

It should be understood that magnet 102 may include a magnetic field or any device that generates a magnetic field. For example, magnet 102 may include a permanent magnet, a magnetic layer, a current loop or coil, an inductor, etc.

Magneto-resistive (MR) sensing may employ any sensor 104 belonging to the MR sensing family, e.g., Anisotropic Magneto-Resistive (AMR), Giant Magneto-Resistive (GMR), Tunnel Magneto-Resistive (TMR), etc.). These MR sensors 104 may be employed to probe a stray field 112 of a magnet in different architectures for position sensing.

Position variations between the magnet 102 and sensors 104a and 104b induce modulation of the magnetic field which is sensed by sensors 104a and 104b. For example, platform 105 may be moved in the x, y, z directions (or combinations thereof) to create variations in the magnetic field 112. FIGS. 1A and 1B depict a change in only the x direction to simplify the explanation.

When platform 105 moves in the x direction relative to the fixed component (either the magnet 102 or the sensors 104a, 104b), there is a change in a magnetic field (indicated by stray-field vectors, $V_{+\Delta x}$ and $V_{-\Delta x}$, associated with sensors 104a and 104b, respectively). The magnetic field strength and orientation are preferable selected in a strategic way to ensure the greatest sensitivity and therefore the most accurate position sensing.

As the platform 105 moves, the magnetic field through the sensors 104a and 104b changes and a position sensing signal is generated. The position sensing signal is preferably a differential signal which subtracts the measured field between the two sensors 104a and 104b (e.g., $V_{+\Delta x} - V_{-\Delta x}$). The differential configuration assists in accounting for drift, rejects effects from stray magnetic fields external to the device and rejects resistance variations due to temperature fluctuations. To counter the effects of drift, stray magnetic fields, and to minimize resistance fluctuations on the MR sensors due to ambient temperature changes, two or more MR sensors are employed in the differential configuration. In this way, as both sensors are placed nearby, rejection of drift and fluctuations as well as stray fields common to both sensors can be achieved, and a signal to noise ratio (SNR) of the position signal can be enhanced. Since both sensors 104a and 104b experience the same conditions, the subtraction results in the elimination of such effects. In this case, the difference results in Ax or the positional change in the x direction.

Figure 2:
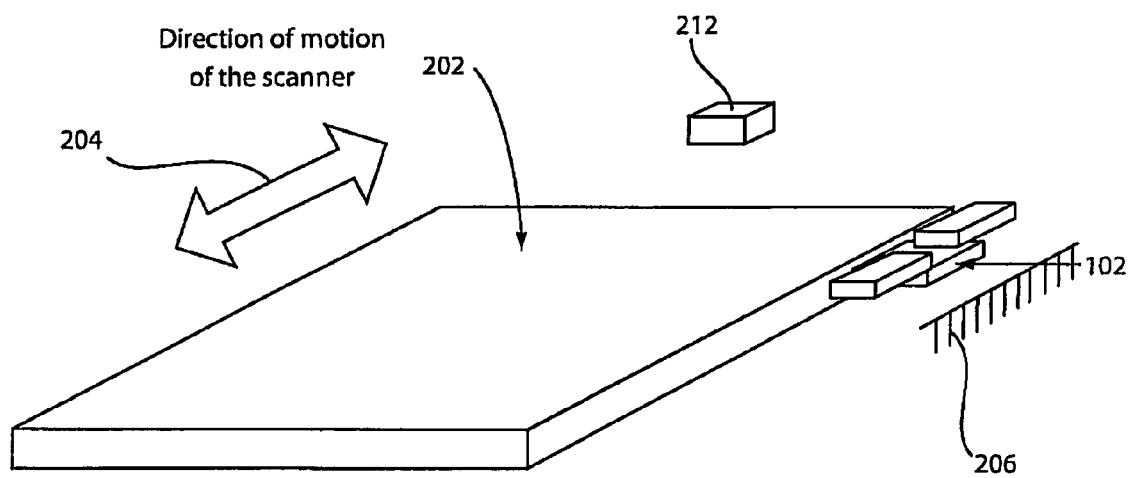
FIG. 2 is a perspective view of a scan table showing a magnet (located on a scan table) and a pair of sensors operatively disposed relative to the scan table in accordance with one illustrative embodiment.

Referring to FIG. 2, a perspective view of a scan table 202 is depicted to demonstrate a particularly useful embodiment in accordance with the present principles. Scan table 202 may be employed in a manufacturing application, on a microscope, an inspection station, alignment device, etc. The illustrative application depicts motion in a single dimension 204. It should be noted that magnet 102 and MR sensors 104a and 104b may be employed for motion in more than one dimension. In one particularly useful embodiment, a set of sensors 104a and 104b and magnet 102 may be orientated for each dimension for which position is to be measured.

One of the magnet 102 or the sensors 104a and 104b is attached to and moves with the scan table 202 (e.g., platform 105). The other of the magnet 102 or the sensors 104a and 104b is attached to a rigid frame 206 adjacent to the scan table 202. The rigid frame 206 acts as a reference position from which sensors 104a and 104b can make relative measurements from. The sensors 104a and 104b include a gap 210 therebetween that is aligned with the sensors 104a and 104b in the direction of motion 204.

When the scan table 202, whose position is to be measured, moves, the motion induces a change in the magnetic field of the magnet 102 passing through the MR sensors 104a and 104b due to the relative movement of the MR sensor 104a, 104b with respect to the stray magnetic field from the magnet 102.

If the sensors 104a and 104b are mounted on the scan table 202, a circuit or circuit connections are needed to measure and process output signals from the sensors. This may include making connections to the sensors located on the scan table through legs (not shown) which connect the scan table to the rigid frame or employing a printed circuit board or a chip 212 on the scan table 202 or employing the board or chip 212 on the rigid frame depending on the configuration. The board or chip 212 may be connected to data acquisition software/equipment, positioning equipment/software, etc. The software may be run on a processing device which may include but is not limited to a computer device or system. The output signals are interpreted and employed as feedback for positioning the scan table 202 or simply for measuring between locations of interest on the scan table 202. Position data may be collected and recorded.

A type of magneto-resistive sensor, e.g., a giant magneto resistive (GMR) sensor, includes a stack having anti-Ferro magnetically pinned layers and soft magnetic free layers having conductive nonmagnetic interlayers. In a high resistance state, e.g., in the absence of an external magnetic field, the magnetic moment in the two magnetic layers is opposite to each other due to ferromagnetic coupling. In the presence of an external magnetic field, the magnetic moment of the magnetically free layer aligns itself in the direction of the external magnetic field by overcoming the anti-Ferro magnetic coupling. Due to interfacial spin-polarized scattering between the ferromagnetic layers separated by conductive layers the electrical resistance of the sensor changes. The resistance varies as a cosine function of the angle between the magnetic moments of the pinned layer and the free layer. The thinner the layers, the higher the resistance change is. A maximum resistance change of a GMR sensor is between about 10% and about 20% and can be as high as 110% at room temperature.

Dimensions of the permanent magnet (or other means for generating stray magnetic field) should be comparable with dimensions of the magneto-resistive sensor so that when the platform moves along any axis, the stray magnetic field through the magneto-resistive sensor changes by different amounts along a sensing direction. The magnetic moment of the soft layer of the sensor aligns itself along the component of the stray magnetic field in its plane and the resistance of the sensor changes. A constant current is passed through the sensor and voltage output from the sensor is used as an imaging signal.

The sensitivity and resolution of position sensing scales proportionally to the sensitivity and resolution of the magneto-resistive sensor. The sensitivity of the method is improved by tuning the spatial distribution of the stray magnetic field through the magneto resistive sensor to exploit its full range of operation of the MR sensor.

The spatial distribution of the stray magnetic field is not linear for large ranges of operation and depends on the size of the magnet. However, for all practical purposes the MR sensor signal can be assumed a linear function of the position of platform. For large ranges of motion, mapping between the MR sensor signal and the position of platform is a static nonlinear map which can be used to interpret the MR sensor signal. This method senses the movement of the positioning stages similar to methods including optical, capacitive, LVDT and piezo-resistive methods and may utilize signal processing techniques used in those methods. In particular, for high speed measurements, high bandwidth, low noise electronics is needed which should also have a good gain to achieve good sensitivity in measurement.

The sensitivity/resolution may be optimized by trial and error, by computation, by design, by experience or combinations thereof. Magneto resistive sensors usually operate at low field strengths starting from zero Oersted to few hundreds of Oersted. At higher field strength the soft magnetic layers get saturated and the sensor loses sensitivity. The stray magnetic field at the MR sensor in its sensitive direction can be oriented by carefully choosing the shape, size and material of a permanent magnet, and the relative position of the magnet with respect to the MR sensor. The stray magnetic field at the MR sensor can also be oriented by using combinations of more than one permanent magnets, magnetic layers and current loops. Magnetism simulation tools can be utilized to simulate various configurations and compute the distribution of the optimal stray magnetic field for sensing.

With careful topological placement of the MR sensors 104 and magnet 102, and through miniaturization, a high bandwidth and high resolution position sensing signal can be obtained. The position sensors 100 can be operated in parallel in an array configuration for local, point-wise motion measurement of elements of larger structures.

The present principles provide substantial advantages over the known solutions in position sensing. For example, very high bandwidth is achieved at low-cost and with miniature form-factors. This is in contrast to the bulky and expensive optical, capacitive and inductive-coil conventional setups. Very high resolution is also achieved. The resolution of the magnetic sensing scheme can theoretically match sub-nanometer resolution of optical/capacitive/LVDT sensing, by appropriate placement of sensors and magnet and miniaturization of both. The potential for MEMS fabrication is available, which is a low cost fabrication technique. The magneto-resistive position sensing in accordance with the present principles advantageously combines the small form-factor and integrated fabrication capability of thereto-electric sensing, as well as the superb bandwidth/resolution performance of optical/capacitive sensing.

Figure 3:
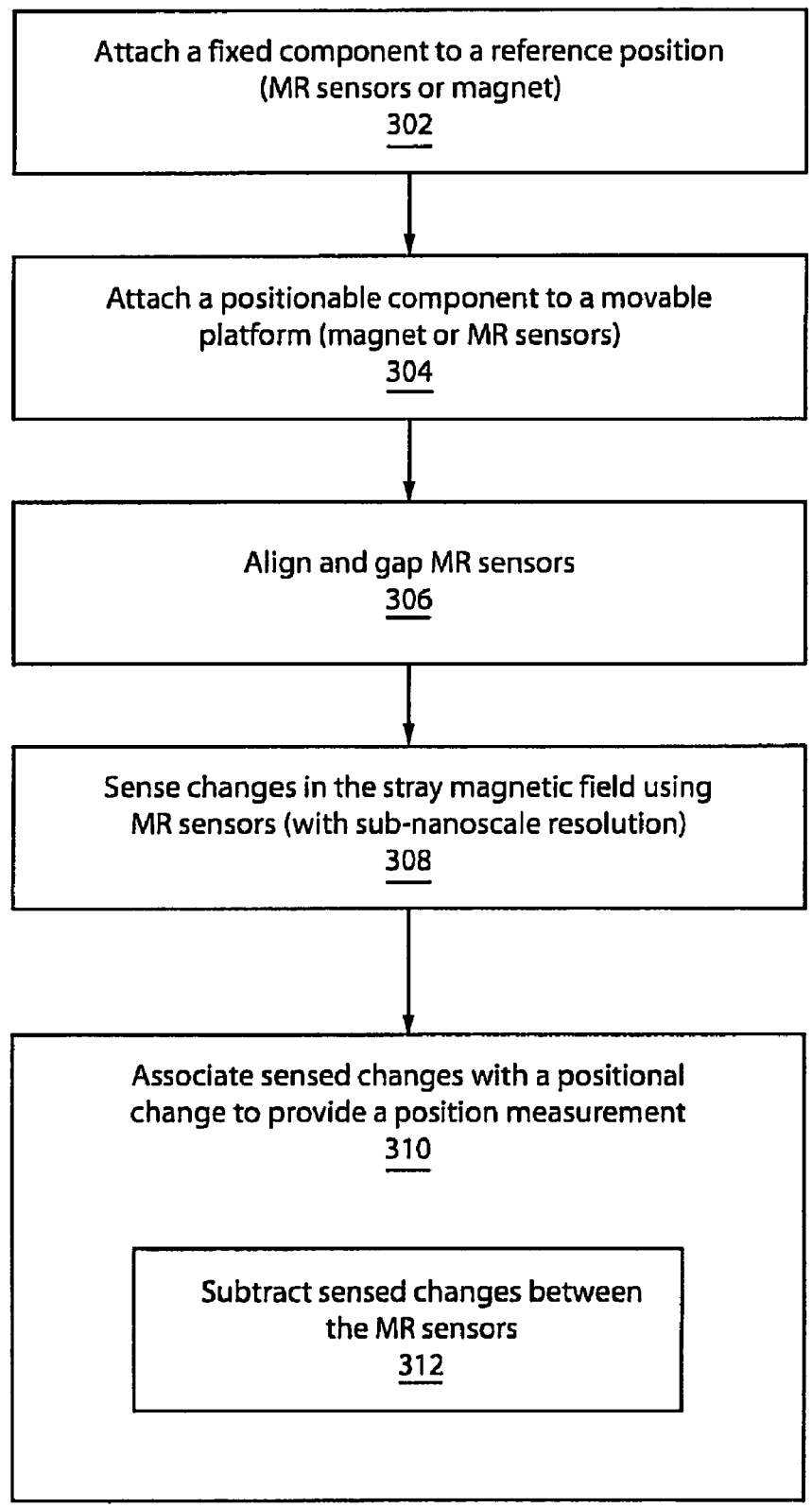
FIG. 3 is a flow diagram showing a method for making positional measurements in accordance with the present principles.

Referring to FIG. 3, a method for position sensing is illustratively depicted. In block 302, a fixed component is attached to a reference position. The fixed component includes one of a magnet and a pair of magneto-resistive sensors. In block 304, a positionable component is provided on a movable platform, such as, e.g., a scan table or the like. The positionable component includes the other of the magnet and the pair of magneto-resistive sensors. The pair of magneto-resistive sensors may include one or more of an Anisotropic Magneto-Resistive WHO sensor, a Giant Magneto-Resistive (GMR) sensor, and a Tunnel Magneto-Resistive (TMR) sensor.

In block 306, the pair of magneto-resistive sensors is aligned along a first direction where the positional change is to be measured, and the pair of magneto-resistive sensors are disposed apart by a distance to form a gap therebetween. In block 308, changes in a stray magnetic field created by a positional change between the fixed component and the positionable component are sensed by the sensors. Changes in position can be determined with a sub-nanoscale resolution.

In block 310, the sensed changes in the stray magnetic field are associated between sensors to measure the positional change. This preferably includes subtracting sensed changes from one of the pair of magneto-resistive sensors from the other of the pair of magneto-resistive sensors to provide a differential configuration in block 312.

Having described preferred embodiments of a system and method for a magneto-resistance based nano-scale position sensor (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A position sensor, comprising:
   a magnetic component;
   a first magneto-resistive sensor disposed in proximity to the magnetic component; and
   a second magneto-resistive sensor disposed in proximity to the magnetic component and the first magneto-resistive sensor wherein the first magneto-resistive sensor and second magneto-resistive sensor are configured to sense changes, with a sub-nanoscale resolution, in a stray magnetic field created by the magnetic component in accordance with a relative positional change between the magnetic component and the first and second magneto-resistive sensors.

2. The sensor as recited in claim 1, wherein the first magneto-resistive sensor and the second magneto-resistive sensor are attached to a same repositionable platform which is moveable relative to a position of the magnetic component.

3. The sensor as recited in claim 1, wherein the magnetic component is attached to a repositionable platform which is moveable relative to both the first magneto-resistive sensor and the second magneto-resistive sensor.

4. The sensor as recited in claim 1, wherein a position is measured by a differential signal which determines a difference between an output of the first magneto-resistive sensor and an output of the second magneto-resistive sensor.

5. The sensor as recited in claim 1, wherein the first magneto-resistive sensor and the second magneto-resistive sensor are arranged in a first direction having a gap between the first magneto-resistive sensor and the second magneto-resistive sensor.

6. The sensor as recited in claim 5, wherein a position measurement is made along the first direction.

7. The sensor as recited in claim 1, wherein the first magneto-resistive sensor and the second magneto-resistive sensor include at least one of Anisotropic Magneto-Resistive (AMR) sensor, a Giant Magneto-Resistive (GMR) sensor, and a Tunnel Magneto-Resistive (TMR) sensor.

8. The sensor as recited in claim 1, wherein the first magneto-resistive sensor and the second magneto-resistive sensor include micro-electro-mechanical-systems (MEMS).

9. The sensor as recited in claim 1, wherein the magnetic component includes at least one of a permanent magnet, a magnetic layer and a current-loop.

10. A position sensor, comprising:
    a magnetic component;
    a first magneto-resistive sensor disposed in proximity of the magnetic component; and
    a second magneto-resistive sensor disposed in proximity to the magnet and the first magneto-resistive sensor wherein the first magneto-resistive sensor and the second magneto-resistive sensor are arranged in a first direction having a gap between the first magneto-resistive sensor and the second magneto-resistive sensor where a position measurement is made along the first direction;
    the first magneto-resistive sensor and second magneto-resistive sensor are configured to sense changes in a stray magnetic field created by the magnetic component in accordance with a relative positional change between the magnetic component and the first and second magneto-resistive sensors in the first direction such that a position is measured by a differential signal which determines a difference between an output of the first magneto-resistive sensor and an output of the second magneto-resistive sensor.

11. The sensor as recited in claim 10, wherein the first magneto-resistive sensor and the second magneto-resistive sensor are attached to a same repositionable platform which is moveable relative to a position of the magnetic component.

12. The sensor as recited in claim 10, wherein the magnetic component is attached to a repositionable platform which is moveable relative to both the first magneto-resistive sensor and the second magneto-resistive sensor.

13. The sensor as recited in claim 10, wherein the first magneto-resistive sensor and the second magneto-resistive sensor include at least one of Anisotropic Magneto-Resistive (AMR) sensor, a Giant Magneto-Resistive (GMR) sensor, and a Tunnel Magneto-Resistive (TMR) sensor.

14. The sensor as recited in claim 10, wherein the magnetic component includes at least one of a permanent magnet, a magnetic layer and a current-loop.

15. A method for position sensing, comprising:
    providing a fixed component attached to a reference position, the fixed component including one of a magnetic component and a pair of magneto-resistive sensors;
    providing a positionable component on a movable platform, the positionable component including the other of the magnetic component and the pair of magneto-resistive sensors;
    sensing changes in a stray magnetic field created by a positional change between the fixed component and the positionable component; and
    subtracting the sensed changes of one of the pair of magneto-resistive sensors from sensed changes of the other of the pair of magneto-resistive sensors to measure the positional change.

16. The method as recited in claim 15, further comprising:
    aligning the pair of magneto-resistive sensors along a first direction where the positional change is to be measured; and
    disposing the pair of magneto-resistive sensors apart by a distance to form a gap therebetween.

17. The method as recited in claim 15, wherein the subtracting provides differentional configuration.

18. The method as recited in claim 15, wherein the pair of magneto-resistive sensors include at least one of Anisotropic Magneto-Resistive (AMR) sensor, a Giant Magneto-Resistive (GMR) sensor, and a Tunnel Magneto-Resistive (TMR) sensor.

19. The method as recited in claim 15, wherein sensing changes includes sensing changes with a sub-nanoscale resolution and a bandwidth exceeding 1 MHz.

* * * * *